(12) United States Patent
Steiert et al.

(10) Patent No.: US 10,616,703 B2
(45) Date of Patent: Apr. 7, 2020

(54) MEMS SOUND TRANSDUCER ELEMENT AND METHOD FOR PRODUCING A MEMS SOUND TRANSDUCER ELEMENT

(71) Applicant: Infineon Technologies AG, Neubiberg (DE)

(72) Inventors: Matthias Steiert, Rosenheim (DE); Horst Theuss, Wenzenbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 76 days.

(21) Appl. No.: 15/946,443

(22) Filed: Apr. 5, 2018

(65) Prior Publication Data

US 2018/0295458 A1      Oct. 11, 2018

(30) Foreign Application Priority Data

Apr. 7, 2017   (DE) .................. 10 2017 205 971

(51) Int. Cl.
| | |
|---|---|
| *H04R 1/00* | (2006.01) |
| *H04R 31/00* | (2006.01) |
| *B81C 1/00* | (2006.01) |
| *B81B 7/00* | (2006.01) |
| *H04R 7/06* | (2006.01) |
| *H04R 19/02* | (2006.01) |

(Continued)

(52) U.S. Cl.
CPC .......... *H04R 31/003* (2013.01); *B81B 7/0061* (2013.01); *B81C 1/00238* (2013.01); *B81C 1/00309* (2013.01); *H04R 7/06* (2013.01); *H04R 19/02* (2013.01); *H04R 19/04* (2013.01); *B81B 2201/0257* (2013.01); *B81B 2203/0127* (2013.01); *B81B 2203/0315* (2013.01); *B81B 2207/012* (2013.01); *B81C 2201/013* (2013.01); *B81C 2203/0118* (2013.01); *B81C 2203/0792* (2013.01); *H04R 1/04* (2013.01); *H04R 2201/003* (2013.01)

(58) Field of Classification Search
CPC ...... H04R 2201/003; B81B 2201/0257; B81B 2201/0228; B81B 2201/0235; B81B 2201/025; B81B 2201/0264; B81B 2201/0285; H01L 41/1132; H01L 41/1138; H01L 41/332; H01L 41/23
USPC ......... 257/252, 419, 416, 254; 381/113, 175
See application file for complete search history.

(56) References Cited

U.S. PATENT DOCUMENTS

| | | |
|---|---|---|
| 2010/0158279 A1 | 6/2010 | Conti et al. |
| 2014/0314254 A1 | 10/2014 | Conti et al. |
| 2015/0102390 A1 | 4/2015 | Liu et al. |

FOREIGN PATENT DOCUMENTS

| | | |
|---|---|---|
| DE | 102005004877 A1 | 8/2006 |
| DE | 102014116129 A1 | 5/2015 |

*Primary Examiner* — Rasha S Al Aubaidi
(74) *Attorney, Agent, or Firm* — Slater Matsil, LLP

(57) ABSTRACT

A method for producing a MEMS sound transducer element includes, inter alia, providing a first substrate. The first substrate has a first substrate side, an opposite second substrate side and a membrane layer arranged on the first substrate side. A further method step includes performing a first etching from the second substrate side in a first surface section that is situated opposite the membrane layer, as far as a first depth. A further method step includes performing a second etching of the first substrate from the second substrate side in a second surface section in order to expose the membrane layer in the first surface section and to produce a back volume for the membrane layer, where the second surface section is larger than the first surface section and includes the first surface section.

25 Claims, 13 Drawing Sheets

(51) Int. Cl.
*H04R 19/04* (2006.01)
*H04R 1/04* (2006.01)

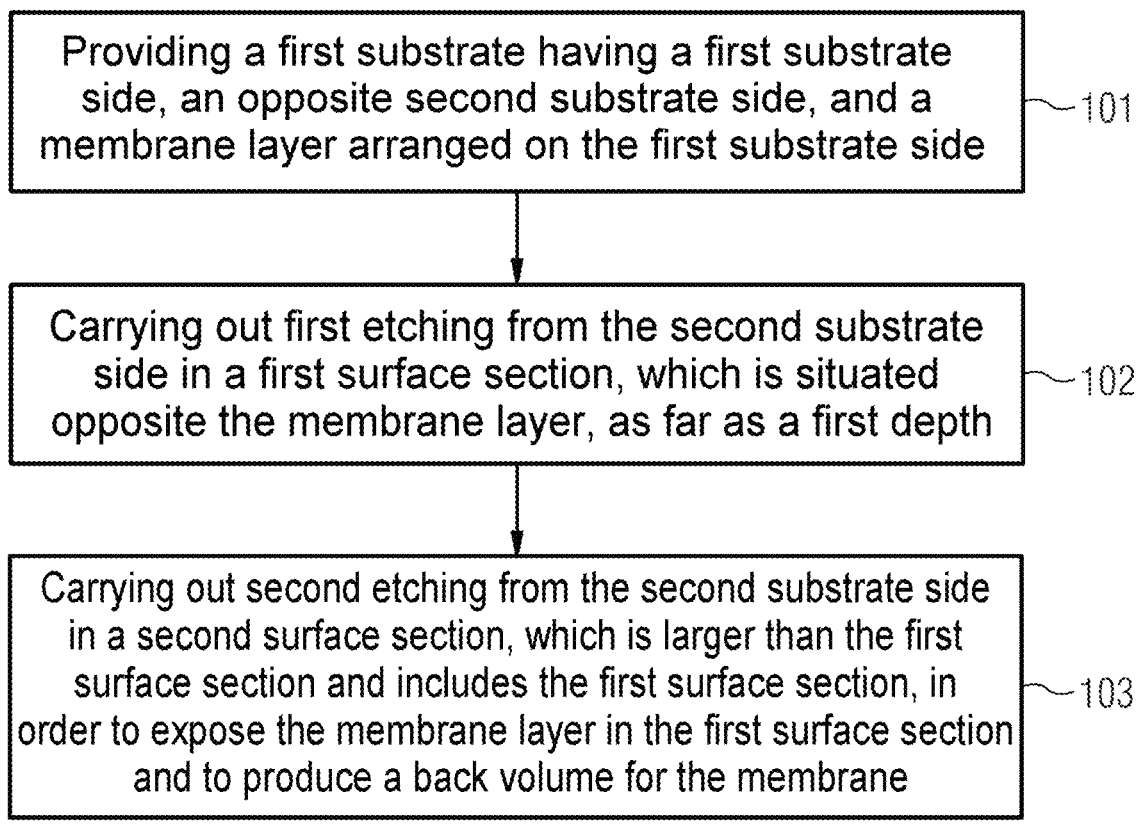

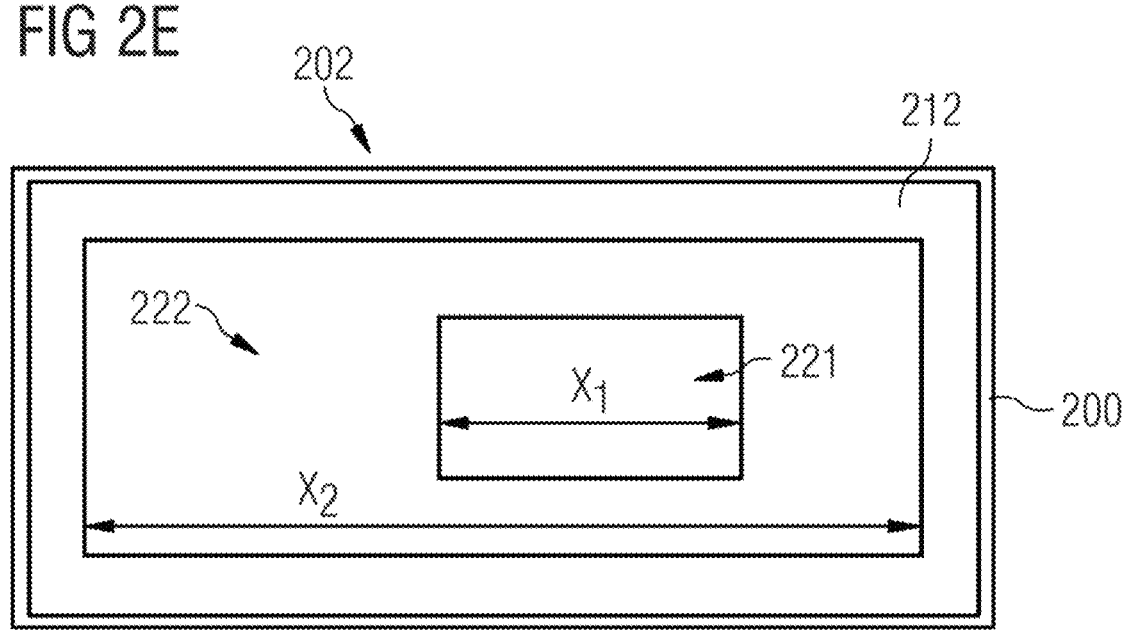
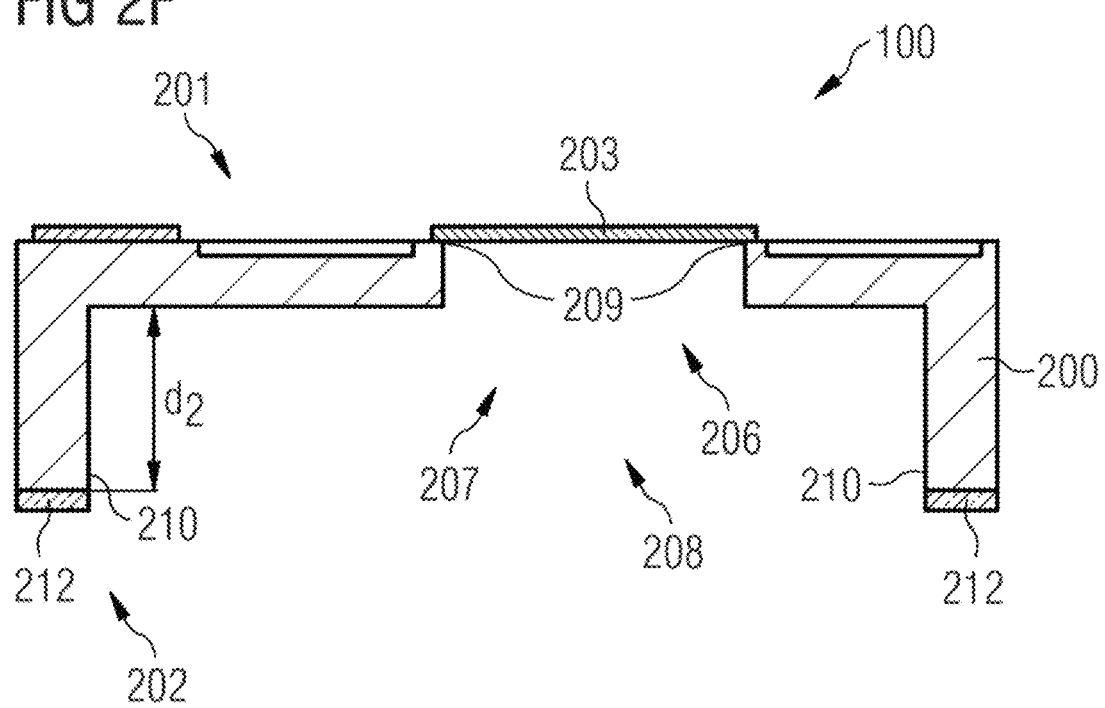

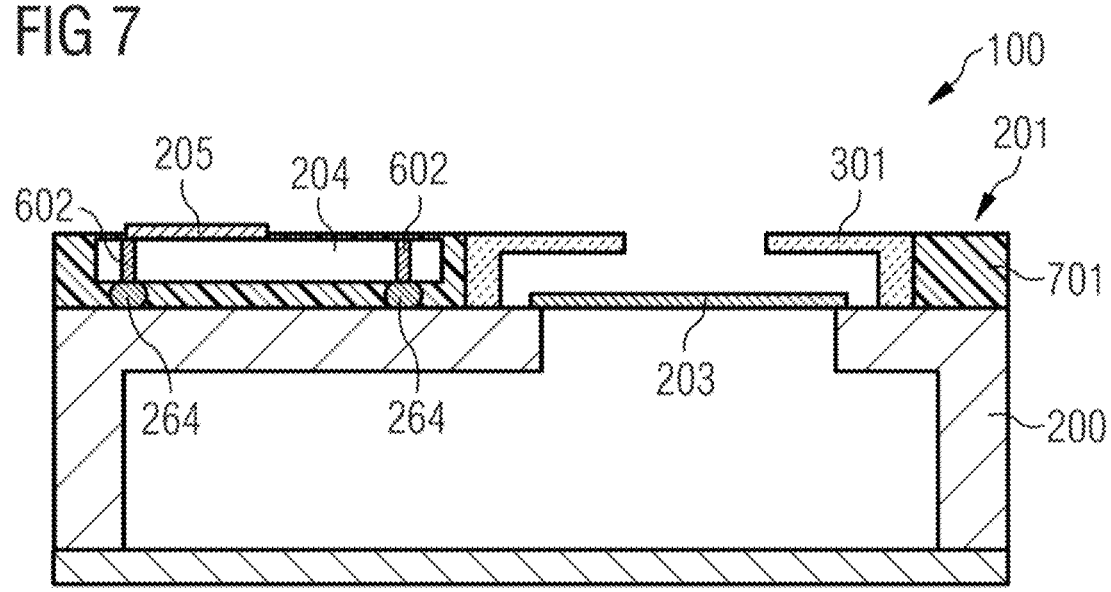
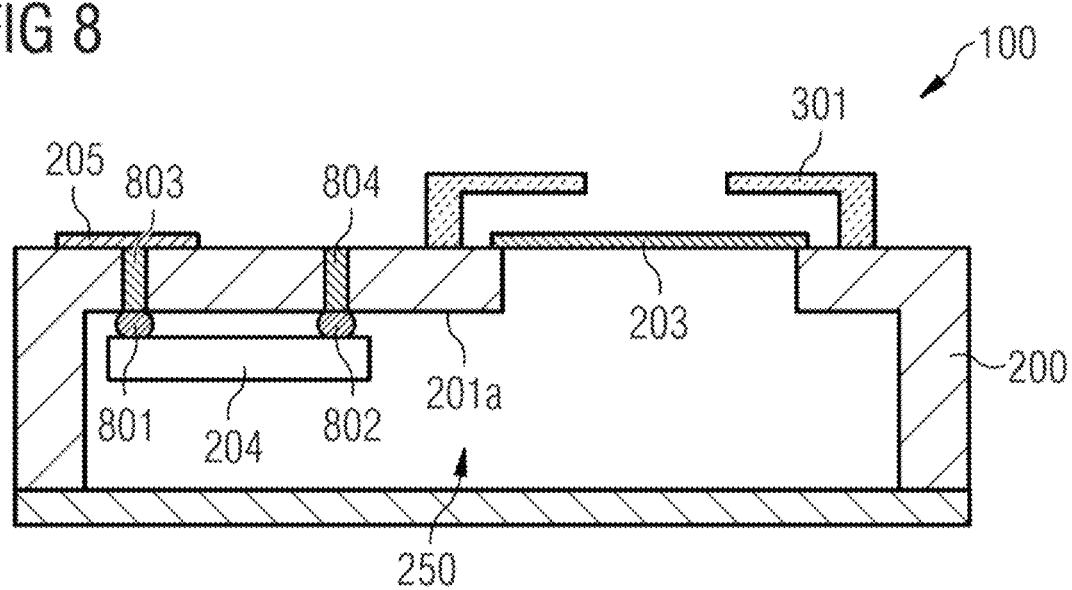

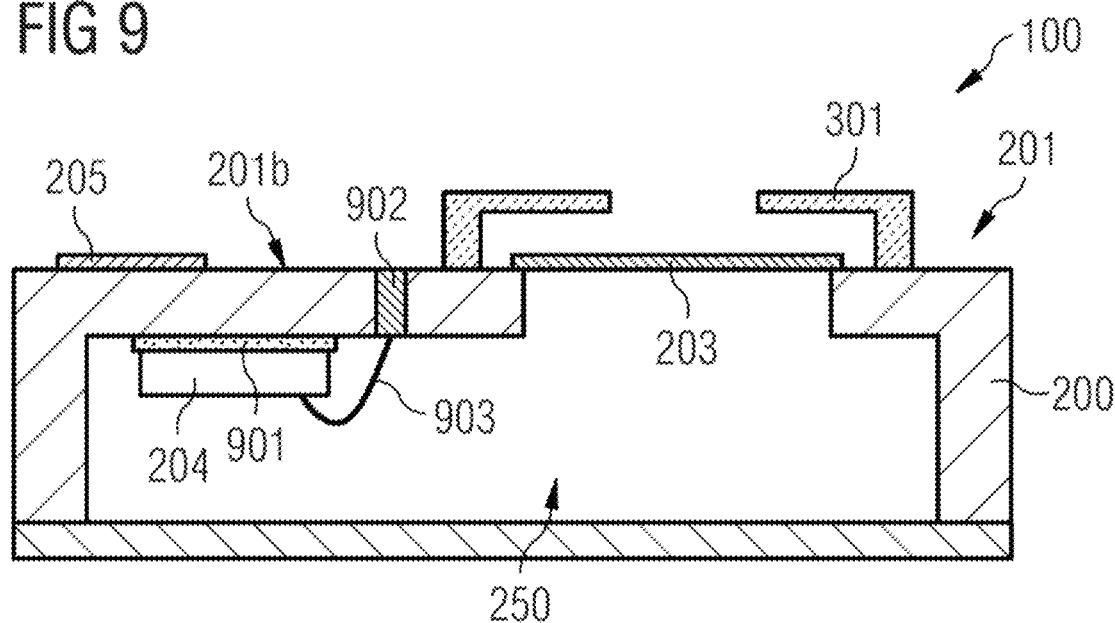
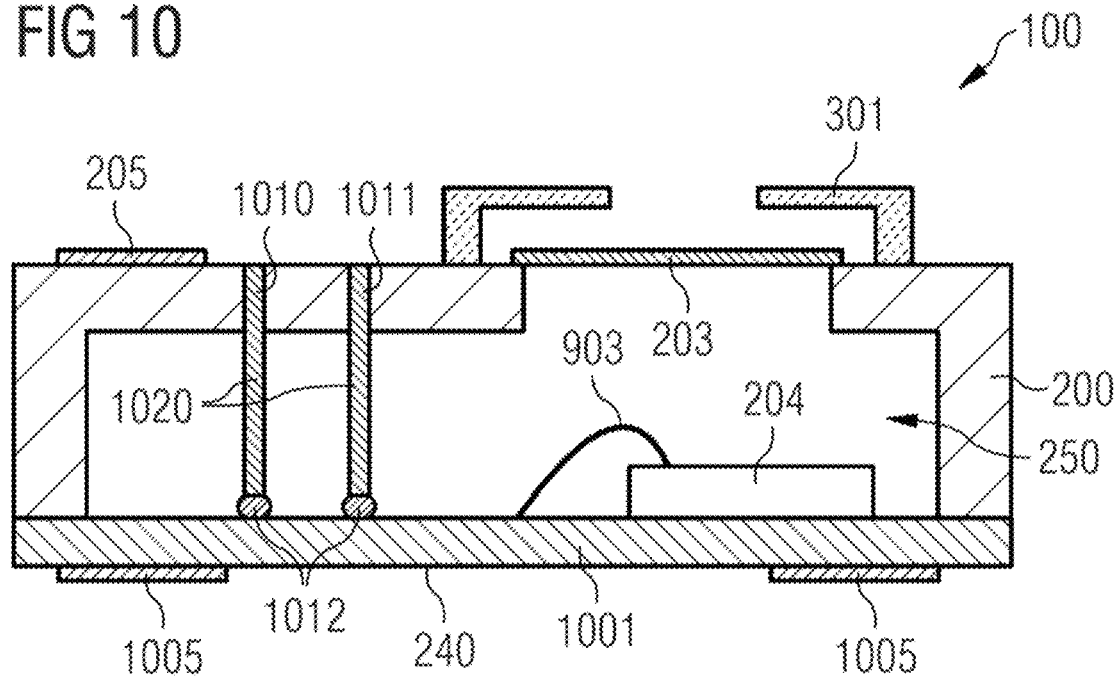

MEMS SOUND TRANSDUCER ELEMENT AND METHOD FOR PRODUCING A MEMS SOUND TRANSDUCER ELEMENT

This application claims the benefit of German Application No. 10 2017 205 971.0, filed on Apr. 7, 2017, which application is hereby incorporated herein by reference in its entirety.

TECHNICAL FIELD

Embodiments of the present disclosure relate to a MEMS sound transducer element and to a method for producing a MEMS sound transducer element, or a wafer level package for a MEMS microphone.

BACKGROUND

MEMS sound transducer elements (MEMS: abbreviation of Micro Electro Mechanical System) can be embodied for example in the form of MEMS microphones or else in the form of MEMS loudspeakers and the like. At the present time, the following two requirements, in particular, are made of such MEMS sound transducer elements:
1.) high acoustic performance with regard to a greater signal-to-noise ratio (SNR); and
2.) small package size.

The acoustic performance is directly correlated with the so-called back volume. A general rule here is: the larger the back volume, the greater the acoustic performance. Accordingly, the first requirement regarding the high acoustic performance is strongly coupled with a large back volume, and hence however also necessarily with a large package size.

SUMMARY

The present disclosure therefore proposes a MEMS sound transducer element and a method for producing a MEMS sound transducer element.

BRIEF DESCRIPTION OF THE DRAWINGS

Exemplary embodiments are illustrated in the drawing and are explained below. In the figures:

FIG. 1 shows a block diagram for illustrating one exemplary embodiment of a method for producing a MEMS sound transducer element;

FIG. 2E shows a plan view of a second substrate side of a first substrate;

FIG. 2F shows a substantive illustration of a further step of one exemplary method for producing a MEMS sound transducer element;

FIG. 7 shows a further exemplary embodiment of a MEMS sound transducer element;

FIG. 8 shows a further exemplary embodiment of a MEMS sound transducer element;

FIG. 9 shows a further exemplary embodiment of a MEMS sound transducer element;

FIG. 10 shows a further exemplary embodiment of a MEMS sound transducer element;

DETAILED DESCRIPTION OF ILLUSTRATIVE EMBODIMENTS

Hereinafter, preferred exemplary embodiments are described in greater detail with reference to the figures, wherein elements having the same or a similar function are provided with the same reference signs. The method steps hereinafter can also be carried out in a different order than that described. Some steps are furthermore optional.

Figure 12:
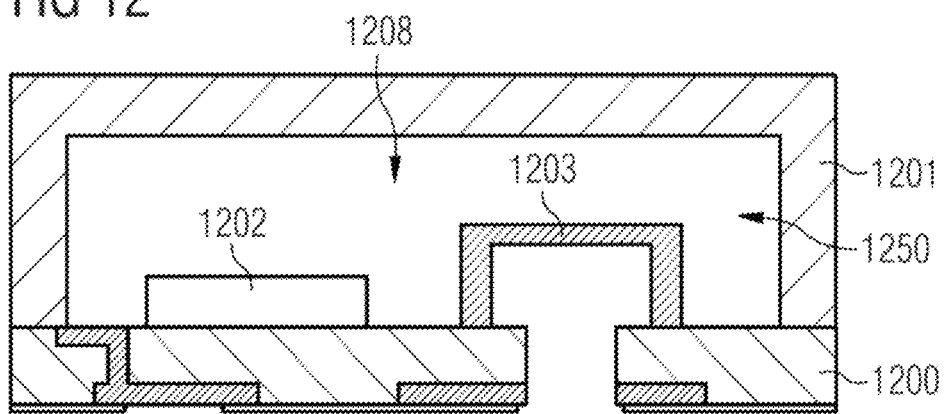
FIG. 12 shows a conventional MEMS microphone in an open cavity package.

Nowadays so-called OCPs (abbreviation of open cavity package) are used for MEMS microphones, for example, as depicted in FIG. 12. In this case, the back volume 1250 of the MEMS microphone is realized by means of a cover 1201 fixed to a substrate 1200. The back volume 1250 is occasionally provided by means of a pre-mold substrate or by means of specific lamination techniques. Various types of covers 1201 and materials are used for this purpose, for example metal caps or molded covers.

The aspect ratio between back volume 1250 and package size is adversely influenced, however, on account of the fact that the individual dies 1202, 1203 are arranged within the cavity 1208 provided. For this reason, the back volume 1250 is reduced by the volume of the individual chips 1202, 1203 and the glob top of the application specific integrated circuit, ASIC for short. The aspect ratio between back volume and package size is thus limited by these known design concepts.

Since, in the case of MEMS sound transducer elements, in general the two requirements mentioned in the background, that is to say acoustic performance and package size, are mutually exclusive and conventional package concepts are not suitable for resolving these contradictions, a novel package concept is desirable. The aspect ratio between back volume and package size should be increased in this case.

FIG. 1 shows a block diagram of a method for producing a MEMS sound transducer element in accordance with the present disclosure.

Block 101 involves providing a first substrate having a first substrate side, an opposite second substrate side and a membrane layer arranged on the first substrate side.

Block 102 involves carrying out first etching from the second substrate side in a first surface section, which is situated opposite the membrane layer, as far as a first depth.

Block 103 involves carrying out second etching from the second substrate in a second surface section, which is larger than the first surface section and includes the first surface section, in order to expose the membrane layer in the first surface section and to produce a back volume for the membrane.

Figure 2A:
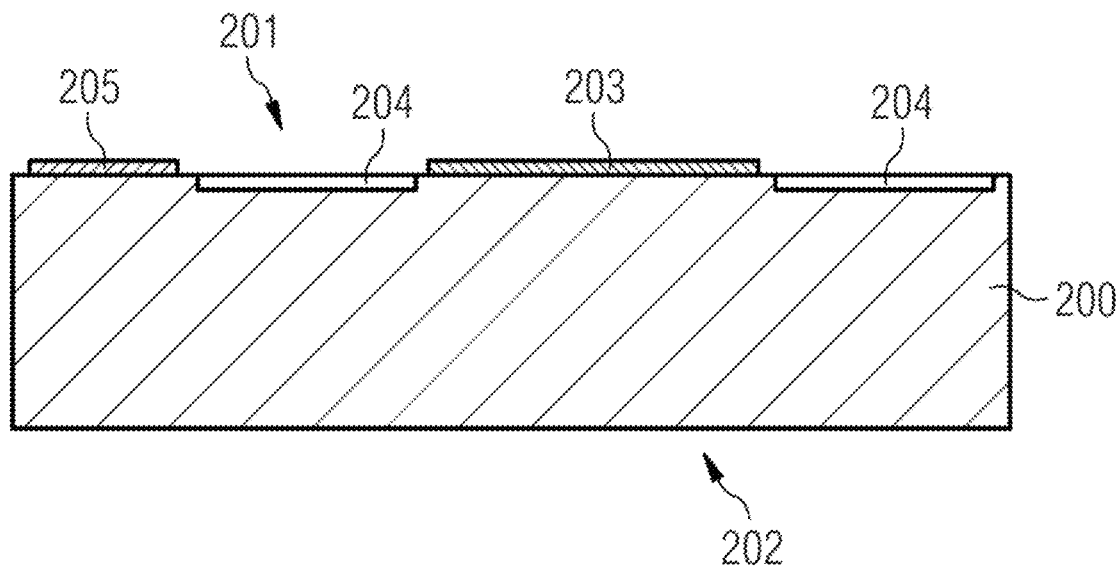
FIG. 2A shows a substantive illustration of one step of one exemplary method for producing a MEMS sound transducer element.

FIGS. 2A to 2G are intended to substantively illustrate the method. In this regard, FIG. 2A shows a first substrate 200 having a first substrate side 201 and an opposite second substrate side 202. A membrane layer 203 is arranged on the first substrate side 201.

The membrane layer 203 can be for example a layer of a material that can be put into an oscillatory state if it is suspended in a freely oscillating fashion. This can be a nitride layer, for example.

A circuit arrangement 204 can optionally be arranged on the first substrate side 201. The circuit arrangement 204 can be integrated in the first substrate 200, as is shown here by way of example. The circuit arrangement 204 can be an application specific integrated circuit, a so-called ASIC. The circuit arrangement 204 can be configured to perform the control of a finished MEMS sound transducer element.

FIG. 2A additionally reveals that a contact pad 205 for electrically contacting the MEMS sound transducer element can optionally also be provided. Said contact pad 205, as depicted, can be arranged on the first substrate side 201 of the first substrate 200.

Figure 2B:
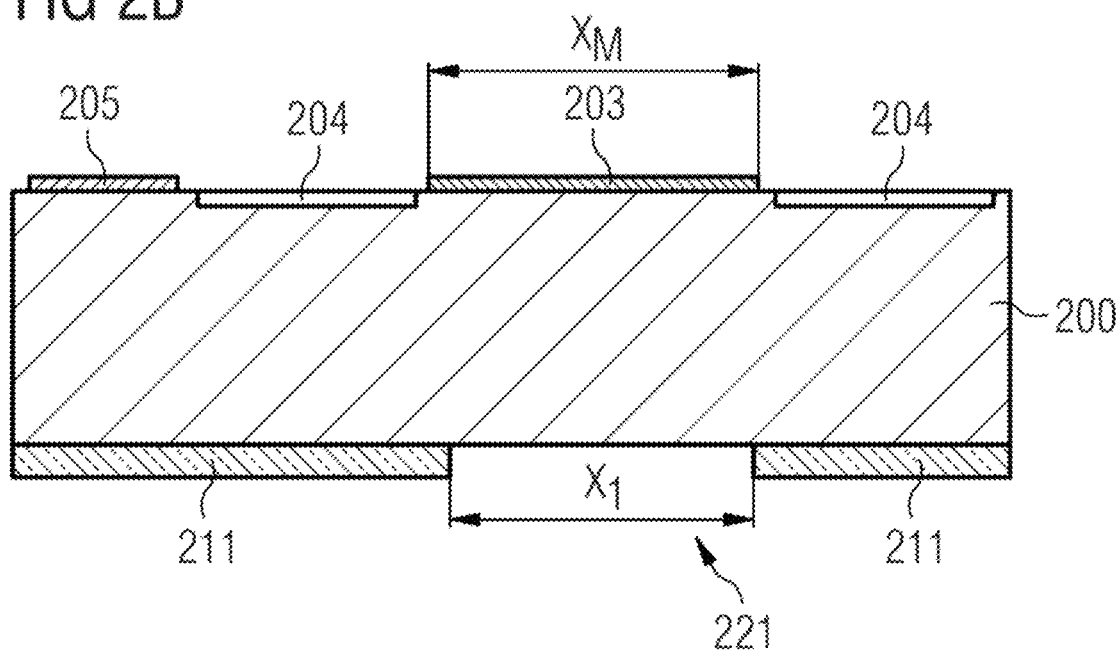
FIG. 2B shows a substantive illustration of a further step of one exemplary method for producing a MEMS sound transducer element.

FIG. 2B shows the first substrate 200 including a first etching mask 211. In this step, still before the first etching described below (FIG. 2C), said first etching mask 211 is applied on the second substrate side 202. A first surface section 221, which is situated opposite the membrane layer 203, is omitted in this case. That is to say that said first surface section 211 of the second substrate side 202 is not covered with the first etching mask 206. Said first surface section 221 has a lateral extent X1 corresponding approximately to the lateral extent XM of the membrane layer. As will be explained in greater detail below, the lateral extent X1 of the first surface section 221 is somewhat smaller than the lateral extent XM of the membrane layer.

After the first etching mask 221 has been applied, the first etching step, or the first etching, is performed using said first etching mask 221. By way of example, customary web-chemical or dry-chemical etching methods can be employed for this purpose.

Figure 2C:
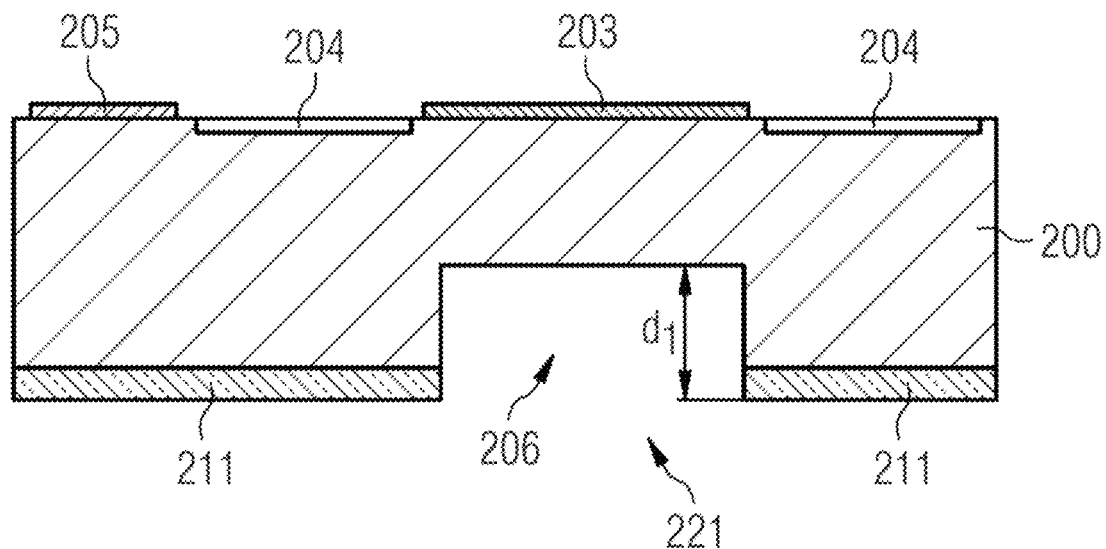
FIG. 2C shows a substantive illustration of a further step of one exemplary method for producing a MEMS sound transducer element.

As can be seen in FIG. 2C, the first etching is performed in the first surface section 221 as far as a first depth $d_1$, thus resulting in a first cavity 206. By way of example, the etching can be time-controlled, wherein etching is effected until the first depth $d_1$ is reached. Alternatively or additionally, an etch stop layer (not depicted here) that determines the first depth $d_1$ can be arranged in the substrate 200.

Figure 2D:
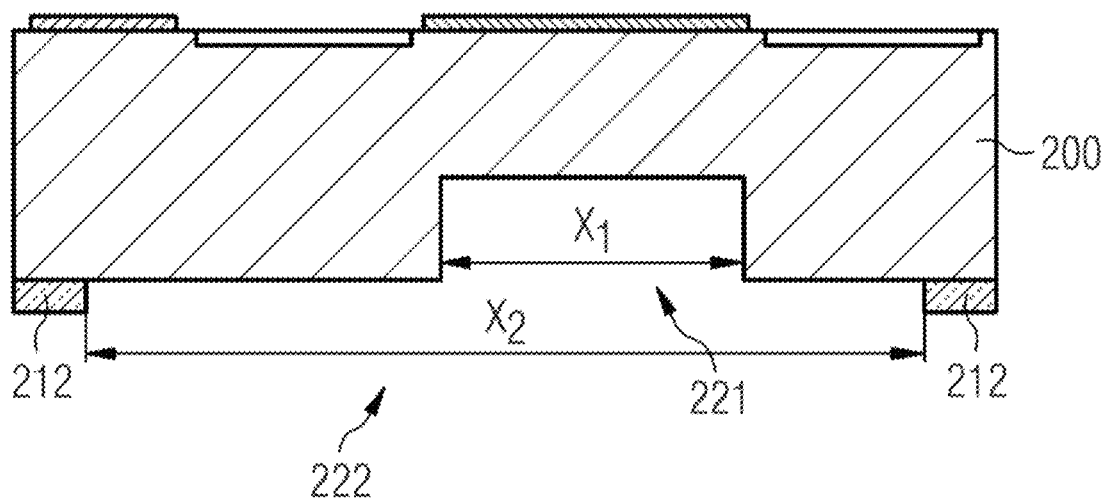
FIG. 2D shows a substantive illustration of a further step of one exemplary method for producing a MEMS sound transducer element.

As can be seen in FIG. 2D, then the first etching mask 211 can be removed and a second etching mask 212 can be applied on the second substrate side 202. Alternatively, however, the first etching mask 211 can also be removed only to an extent such that the depicted sections 212 of the first etching mask 211 remain on the second substrate side 202. Said sections 212 would accordingly then form the second etching mask 212 mentioned initially.

The second etching mask 212 omits a second surface section 222 on the second substrate side 202. That is to say that said second surface section 222 is not covered by the second etching mask 212. The second surface section 222 is larger in terms of area than the first surface section 221 and has a lateral extent X2 that is larger than the lateral extent X1 of the first surface section 221.

For clarification and illustration of the surface sections 221, 222 just mentioned, reference is made to FIG. 2E. FIG. 2E shows a plan view of the second substrate side 202. The second etching mask 212 is arranged here circumferentially at the lateral edge sections of the second substrate side 202. The second etching mask 212 can extend right up to the outermost edges of the second substrate side 202. However, it is also possible, for example for production engineering reasons, as depicted, for the second etching mask 212 not to extend exactly up to the edges of the second substrate side 202.

It is evident, however, that the second etching mask 212 surrounds or encompasses the first surface section 221. To put it another way, the second surface section 222 includes the first surface section 221.

After the second etching mask 212 has been applied, in this case the second etching step, or the second etching, is carried out using the second etching mask 212. The result is depicted in FIG. 2F.

In the second surface section 222, etching was thus carried out in the second surface section 221 from the second substrate side 202 in the direction of the first substrate side 201 as far as a second depth $d_2$. This results in the second cavity 207 depicted. The first cavity 206 obtained in the first etching step and the second cavity 207 obtained in the second etching step jointly form a large cavity 208.

It is clearly evident that, during said second etching step, the membrane layer 203 is exposed within the first surface section 221 etched previously. That is to say that the first cavity 206 obtained in the first etching step reverts further in the direction of the first substrate surface 201 in the second etching step. In this case, the second etching step is performed at least until the first cavity 206 reaches the first substrate side 201.

As a result, an opening 209 is defined in the first substrate side 201, said opening exposing the membrane layer 203. The membrane layer 203 can thus oscillate freely above said opening 209.

The structure depicted in FIG. 2F shows the finished MEMS sound transducer element 100 in accordance with aspects of the present disclosure.

The MEMS sound transducer element 100 accordingly comprises a first substrate 200 having a first substrate side 201, an opposite second substrate side 202 and a membrane layer 203 arranged on the first substrate side 201.

The first substrate 200 has a cavity 208, which in the region of the membrane layer 203 defines a first opening 209 in the first substrate side 201. As explained above with reference to FIG. 2E, the first cavity 208, and thus also the first opening 209 formed thereby, extends over the first surface section 221. As can be seen once again in FIG. 2F, the membrane layer 203 is thus in other words arranged in a freely oscillating fashion above said first opening 209.

The cavity 208 also defines a second opening 210, specifically in the second substrate side 202. Said second opening 210 extends over the abovementioned second surface section 222, which is larger than the first surface section 221 and includes the first surface section 221.

The cavity 208 obtained by means of the two-stage etching process described forms a back volume of the MEMS sound transducer element 100. Before said back volume is explained in greater detail, however, an alternative conceivable arrangement of the two etching masks 211, 212 will also be explained beforehand with reference to FIG. 2G.

Here both etching masks 211, 212 are arranged at the second substrate side 202 before the first and second etching steps are carried out. In this case, the first etching mask 211 can cover the second etching mask 212 at least in sections, as depicted. The etching masks 211, 212 themselves otherwise correspond to the etchings masks 211, 212 described above.

That is to say that the first etching mask 211 does not cover the second substrate side 202 in the region of the first surface section 221 situated opposite the membrane layer 203. To put it another way, the first etching mask 211 has a cutout situated at least in sections in the first surface section 221 situated opposite the membrane layer 203. The second etching mask 212 surrounds or encompasses the second surface section 212, which is greater than the first surface section 221 and includes the first surface section 211.

Figure 2G:
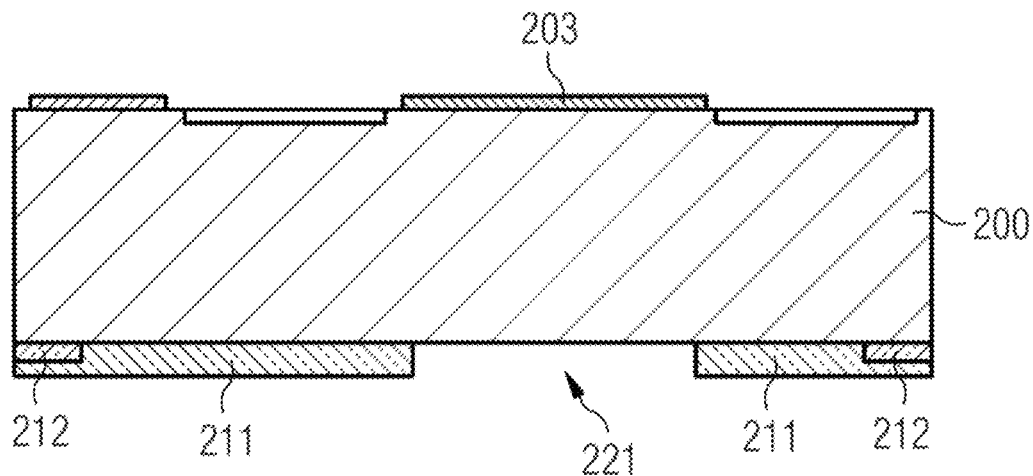
FIG. 2G shows a substantive illustration of a further step of one exemplary method for producing a MEMS sound transducer element.

In the case of this alternative common arrangement, shown in FIG. 2G, of the two etching masks 211, 212, the first etching step can be performed using the first etching mask 211, wherein the second etching mask 212 is arranged in a protected fashion below the first etching mask 211. The structure depicted in FIG. 2C is then obtained after the first etching.

After the first etching, the first etching mask 211 can then be removed, wherein the second etching mask 212 remains on the second substrate side 202 (FIG. 2D). Afterward, the second etching can then be carried out using the second etching mask 212. The MEMS sound transducer element 100 depicted in FIG. 2F is then obtained again as a result.

Figure 2H:
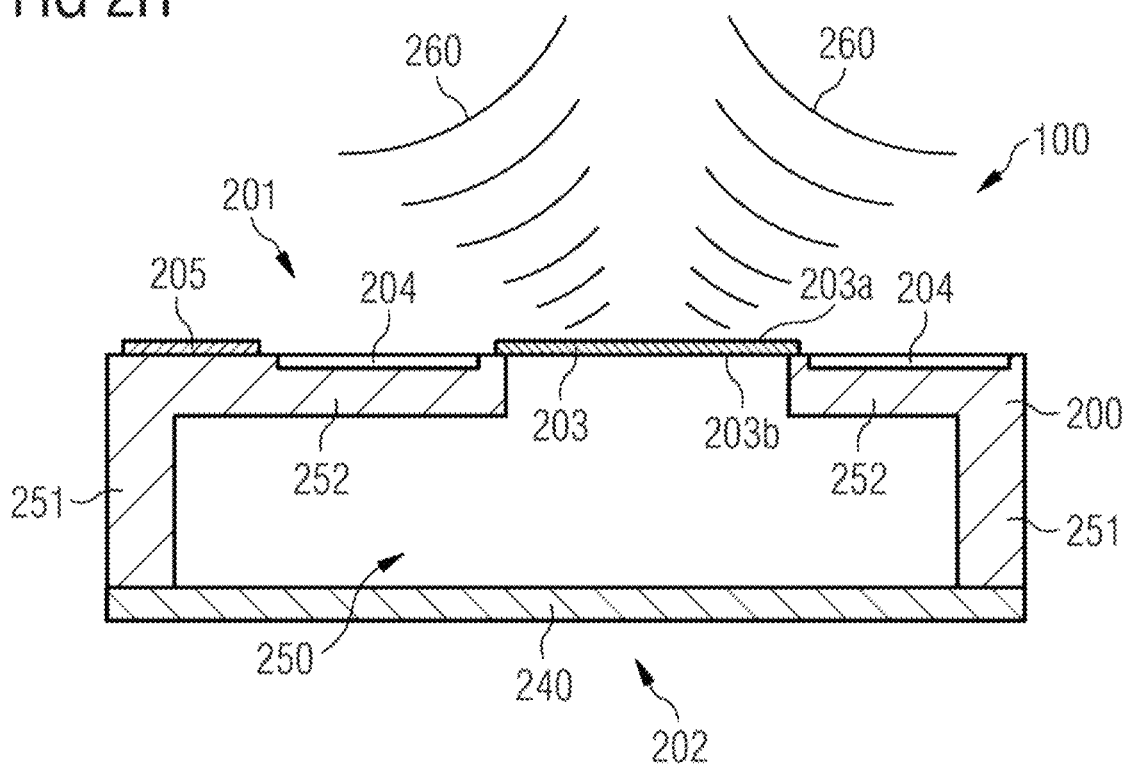
FIG. 2H shows a substantive illustration of a further step of one exemplary method for producing a MEMS sound transducer element.

FIG. 2H shows a further conceivable exemplary embodiment of a MEMS sound transducer element 100. Here a cover 240 is additionally applied on the second substrate side 202. The cover 240 as it were closes the cavity 208. That is to say that the cover 240 together with the first substrate 200 forms a closed cavity 208, which provides a closed back volume 250 for the MEMS sound transducer element 100 or for the membrane layer 203.

As is shown in FIG. 2H, sound waves 260 impinge on the membrane layer 203. To put it more precisely, said sound waves 260 impinge on a side 203a of the membrane layer 203 facing away from the first substrate side 201. As a result, the membrane layer 203 is deflected in the direction of the back volume 250. Since the membrane layer 203 is arranged in a freely oscillating fashion, it thereupon begins to oscillate at the excitation frequency.

The back volume is thus defined as it were as a volume on the back side of the membrane layer 203, wherein the back side is that side into which the membrane layer 203 is initially deflected upon the impingement of sound waves 260.

The larger the back volume 250, the lower the back pressure appears in the oscillations of the membrane layer 203. The membrane layer 203 can thus oscillate with larger amplitudes, as a result of which the signal-to-noise ratio can be increased. Moreover, a larger back volume 250 heats up less rapidly than a comparable smaller back volume. Consequently, less heat-dictated expansion of the medium enclosed in the back volume 250 occurs in the larger back volume 250.

As has already been mentioned in the introduction, the MEMS sound transducer element 100 can comprise a circuit arrangement 204. In the example depicted here, the circuit element 204 is implemented as an ASIC integrated in the first substrate side 201.

The MEMS sound transducer element 100 is thus not only a functional MEMS sound transducer, rather the MEMS sound transducer element 100 simultaneously also forms the entire package for the functional MES sound transducer. Besides the membrane layer 203, the package can also comprise the circuit arrangement 204 for controlling the MEMS sound transducer.

In this case, the cavity 207 obtained during the second etching produces the side walls 251 and the top sides 252 of the package. Consequently, the entire volume of the entire package can serve as the back volume 250 for the MEMS sound transducer or the membrane layer 203. Consequently, a back volume 250 that is as large as possible is obtained in conjunction with the simultaneous possibility of reducing the package size.

Figure 3:
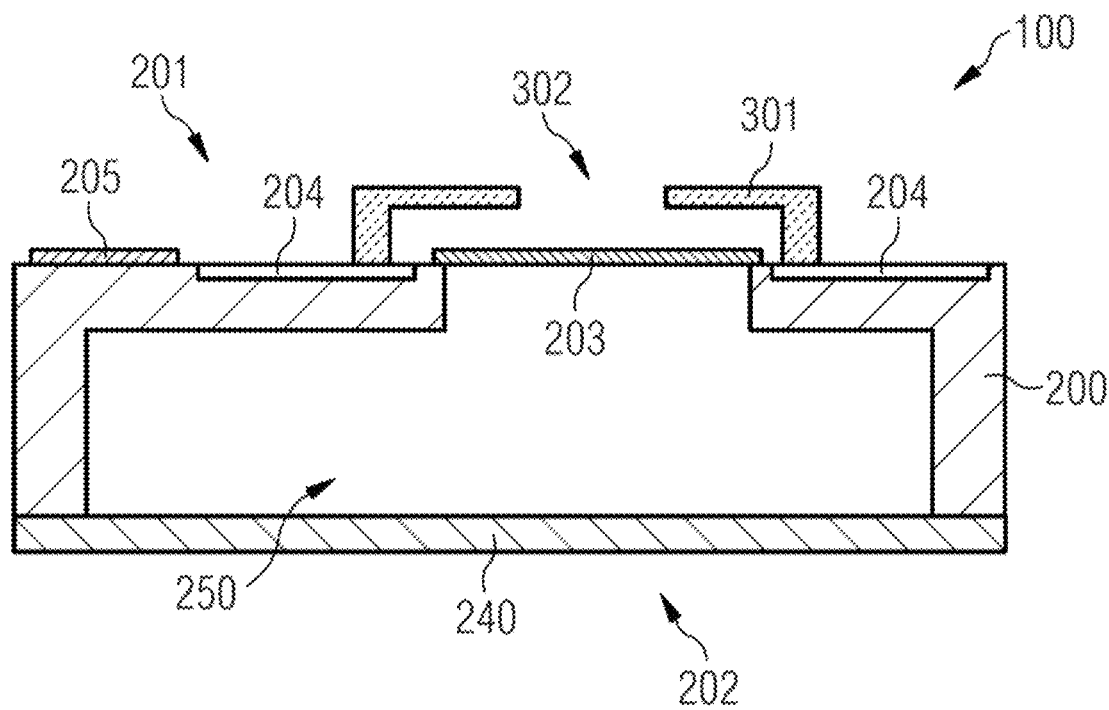
FIG. 3 shows one exemplary embodiment of a MEMS sound transducer element.

FIG. 3 shows a further exemplary embodiment of a MEMS sound transducer element 100 to be obtained by means of the method disclosed herein. This exemplary embodiment differs from the examples described above in that it additionally comprises an optional covering 301 for protecting the membrane layer 203.

The covering 301 is arranged on the first substrate side 201 and in a manner spaced apart from the membrane layer 203. The covering 301 covers the membrane layer 203 at least in sections and thus forms a protection of the membrane layer 203 toward the outside. In order nevertheless to enable the abovementioned sound waves 260 to advance to the membrane layer 203, the covering 301 has an opening 302 situated opposite the membrane layer 203.

Figure 4:
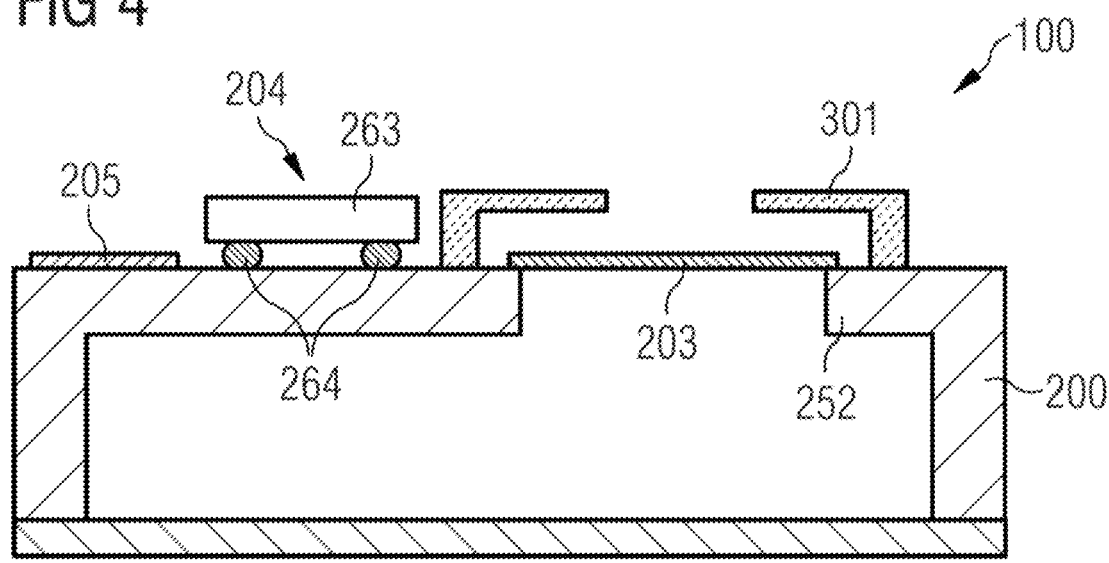
FIG. 4 shows a further exemplary embodiment of a MEMS sound transducer element.

FIG. 4 shows a further exemplary embodiment of a MEMS sound transducer element 100. Here, too, the MEMS sound transducer element 100 again comprises an optional covering 301. However, this exemplary embodiment is also conceivable without said covering 301.

In contrast to the MEMS sound transducer elements described above, the circuit arrangement 204 here is not embodied as a circuit arrangement integrated in the first substrate side 201, but rather as a circuit arrangement 204 embodied in a separate element 263. This circuit arrangement 204 can in turn be an ASIC integrated in said separate element 263.

In this case, the circuit arrangement 204 can be at least mechanically or electrically coupled to the MEMS sound transducer element 100 or the substrate 200 by means of solder balls 264.

Figure 5:
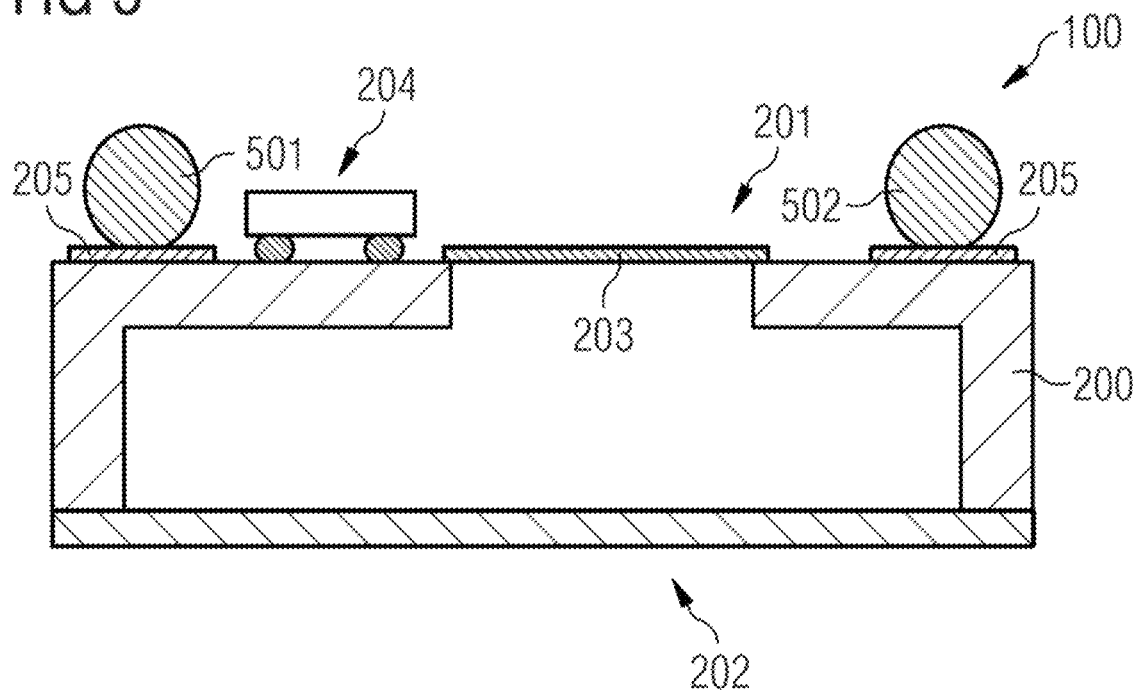
FIG. 5 shows a further exemplary embodiment of a MEMS sound transducer element.

FIG. 5 shows a further exemplary embodiment of a MEMS sound transducer element 100. This exemplary embodiment can comprise an optional covering 301 (not depicted here).

As has indeed already been mentioned above, the MEMS sound transducer element 100 can comprise contact sections 205 for electrically contacting the MEMS sound transducer element 100. Said contact sections 205 can be arranged on the first substrate side 201. The contact sections 205 can be embodied for example as so-called solder pads.

As is shown in FIG. 5, so-called solder balls 501, 502 can in turn be arranged on the contact sections 205. By means of said solder balls 501, 502, the MEMS sound transducer element 100 can be connected for example to a printed circuit board and such like, not illustrated here.

In this case, the solder balls 501, 502 should be spaced apart from the first substrate side 201 further than the membrane layer 203, in order to enable the membrane layer 203 to oscillate freely. Furthermore, the solder balls 501, 502 can also be spaced apart from the first substrate side 201 further than the circuit arrangement 204.

Figure 6:
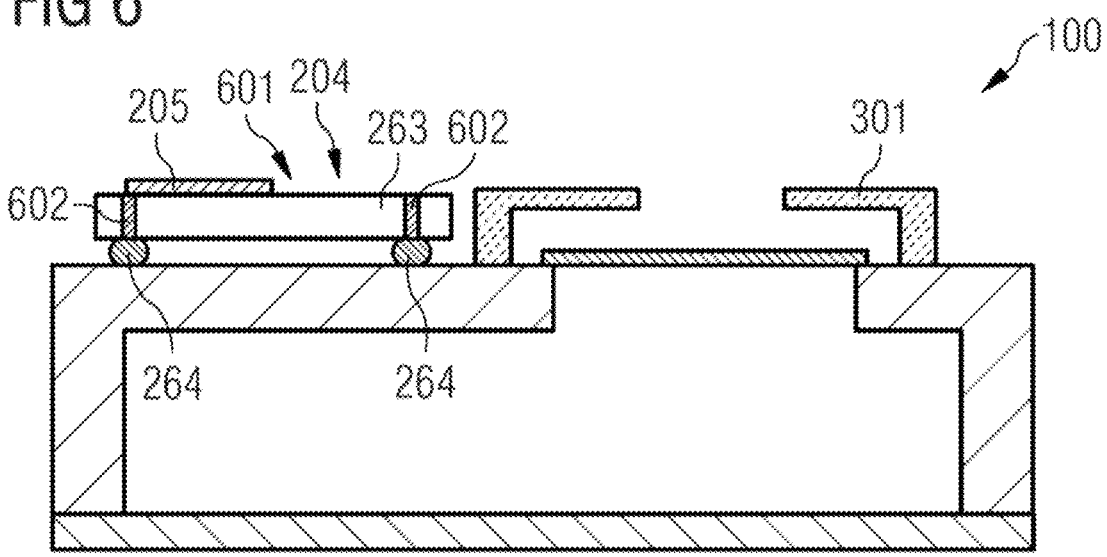
FIG. 6 shows a further exemplary embodiment of a MEMS sound transducer element.

FIG. 6 shows a further conceivable exemplary embodiment of a MEMS sound transducer element 100. The contact section 205 for electrically contacting the MEMS sound transducer element 100 is provided here, wherein said contact section 205 is arranged on a side 263 of the circuit arrangement 204 facing away from the first substrate side 201.

The circuit arrangement 204 here can again be provided in a separate element 263, wherein the contact section 205 in this case is arranged on a side 263 of the separate element 263 and of the circuit arrangement 204 facing away from the first substrate side 201.

Furthermore, here, too, the circuit arrangement 204 can again be at least mechanically or electrically coupled to the first substrate side 200 by means of solder balls 264.

It is also conceivable for the separate element 263 or the circuit arrangement 204 to have plated-through holes 602 that electrically connect the solder balls 264 to the contact section 205. The plated-through holes 602 can be embodied for example as so-called TSVs (abbreviation of through silicon via).

In this exemplary embodiment too, the MEMS sound transducer element 100 can comprise an optional covering 301 for the membrane layer 203. In this case, the covering 301 can be spaced apart approximately to the same distance as the contact section 205 arranged on the circuit arrangement 204.

FIG. 7 shows a further conceivable exemplary embodiment of a MEMS sound transducer element 100, which substantially corresponds to the MEMS sound transducer element 100 described above with reference to FIG. 6. One difference is that at least the first substrate side 201 is potted with a potting compound 701.

In this exemplary embodiment, the circuit arrangement 204 is additionally potted with the potting compound 701. A contact section 205 can be potted with the potting compound 701 at least in sections, although a large portion of the contact section 205 should be exposed.

The covering 301 should also be exposed for the most part. Alternatively, however, the covering 301 can likewise be potted with the potting compound 701.

FIG. 8 shows a further conceivable exemplary embodiment of a MEMS sound transducer element 100. In this embodiment, the circuit arrangement 204 is arranged within the back volume 250. In this case, as depicted, the circuit arrangement 204 can be electrically conductively coupled to the contact section 205 for example by means of solder balls 801, 802 and plated-through holes 803, 804.

The circuit arrangement 204 here is arranged adjacent to the side 201a of the first substrate side 201 facing the back volume 250. However, it would also be conceivable for the circuit arrangement 204 to be integrated in the side 201a of the first substrate side 201 facing the back volume 250.

FIG. 9 shows a further conceivable exemplary embodiment of a MEMS sound transducer element 100. In this embodiment, too, the circuit arrangement 204 is arranged within the back volume 250.

The circuit arrangement 204 can be arranged, as depicted, on the side 201a of the first substrate side 201 facing the back volume 250. By way of example, a securing medium 901 such as, for example, solder, adhesive and the like can be used for this purpose.

A plated-through hole 902 can be provided in the first substrate side 201, said plated-through hole forming a contact section or being electrically coupled to the contact section 205 on the top side 201b of the first substrate side 201 facing away from the back volume.

The connection between the plated-through hole 902 and the circuit arrangement 204 arranged in the back volume 250 can be realized for example by means of a bonding wire 903 or the like.

FIG. 10 shows a further conceivable exemplary embodiment of a MEMS sound transducer element 100. In this case, by way of example, the cover 240 described above can be embodied in the form of a substrate 1001, e.g. as a laminate substrate, a printed circuit board PCB or the like.

A contact section 1005, for example in the form of a solder pad, can be provided on a side of the substrate 1001 facing away from the back volume 250. A circuit arrangement 204 can be provided on a side of the substrate 1001 facing the back volume 250, wherein said circuit arrangement is then in turn arranged within the back volume 250.

The circuit arrangement 204 can be electrically conductively coupled to the substrate 1001 for example by means of bonding wires 903 and the like. Moreover, conductors 1020 can be provided, which electrically conductively connect the laminate substrate 1001 to the first substrate side 201 of the first substrate 200 or to one or more contact sections 205 arranged on the first substrate side 201 of the first substrate 200.

By way of example, as depicted, so-called stacking wires 1020 can be used for this purpose. The stacking wires 1020 can be at least mechanically or electrically connected to the laminate substrate 1001 for example by means of solder, adhesive and the like, for example by means of so-called C-glue. However, an electrical connection can for example also be realized by means of a so-called wire in bump method.

A description will be given below, with reference to FIGS. 11A to 11J, of one exemplary embodiment of a method comprising a plurality of steps, by which method a MEMS sound transducer element 100 is producible. The steps depicted here can also be implementable in a different order than that described below.

Figure 11A:
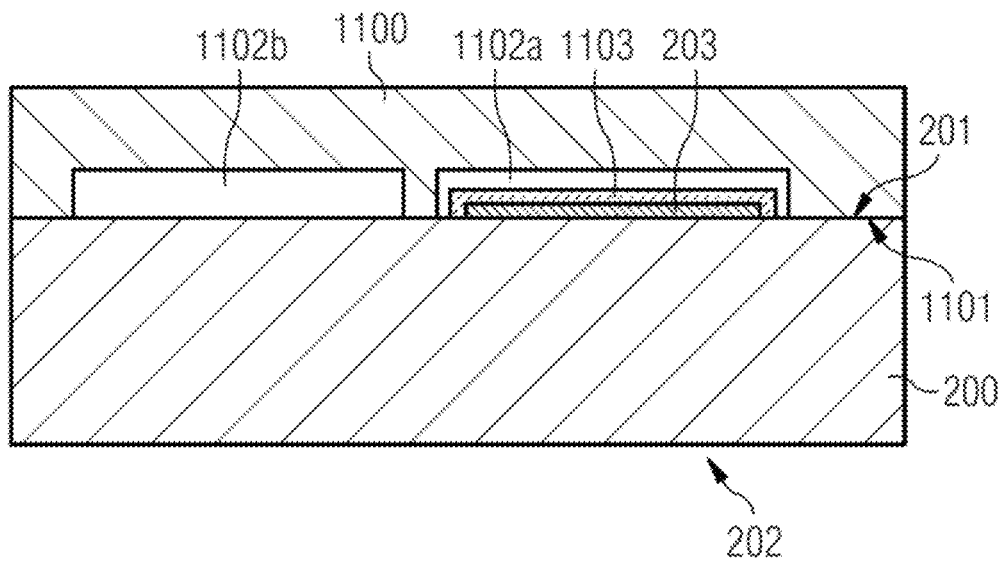
FIG. 11A shows a substantive illustration of one step of one exemplary method for producing a MEMS sound transducer element.

FIG. 11A depicts a first substrate 200 having a first substrate side 201 and an opposite second substrate side 202. A membrane layer 203 is arranged on the first substrate side 201.

The membrane layer 203 can be provided with a protective layer 1103 for the protection of the membrane layer for subsequent process steps. As depicted, said protective layer 1103 can be arranged on a side of the membrane layer 203 facing away from the first substrate side 201 of the first substrate 200.

A second substrate 1100 is arranged on the first substrate side 201 of the first substrate 200. The second substrate 1100 has at least one cavity 1102a. The cavity 1102a is formed in a substrate side 1101 of the second substrate 1101 facing the first substrate side 201 of the first substrate 200.

The second substrate 1100 is arranged on the first substrate side 201 of the first substrate 200 in such a way that the membrane layer 203 is situated within the cavity 1102a.

The second substrate 1100 can furthermore have a second cavity 1102b. The second cavity 1102b is likewise formed in a substrate side 1101 of the second substrate 1100 facing the first substrate side 201 of the first substrate 200.

The second substrate 1100 later forms the covering 301 described above and can therefore also be referred to as a covering substrate. The first and second substrates 200, 1100 can be bonded to one another for example by means of wafer bonding.

Figure 11B:
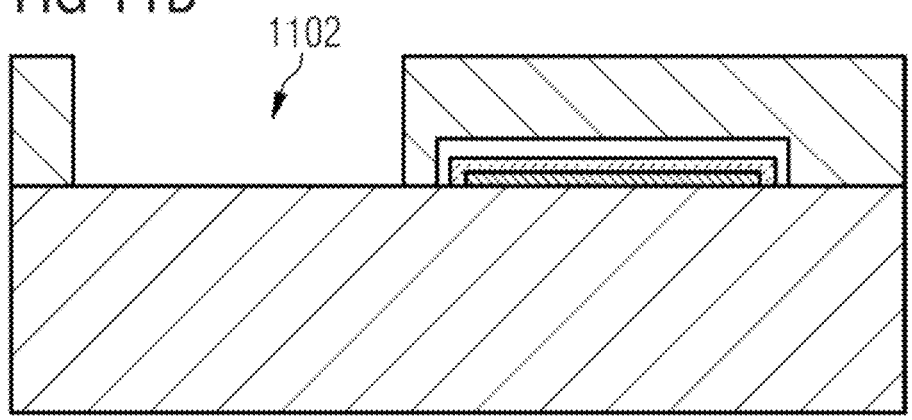
FIG. 11B shows a substantive illustration of a further step of one exemplary method for producing a MEMS sound transducer element.

In FIG. 11B, the second cavity 1102b is opened. That is to say that that section of the second substrate 1100 which is arranged above the second cavity 1102b is removed, such that the first substrate side 201 of the first substrate 200 is exposed and is accessible through this opened second cavity 1102b.

Figure 11C:
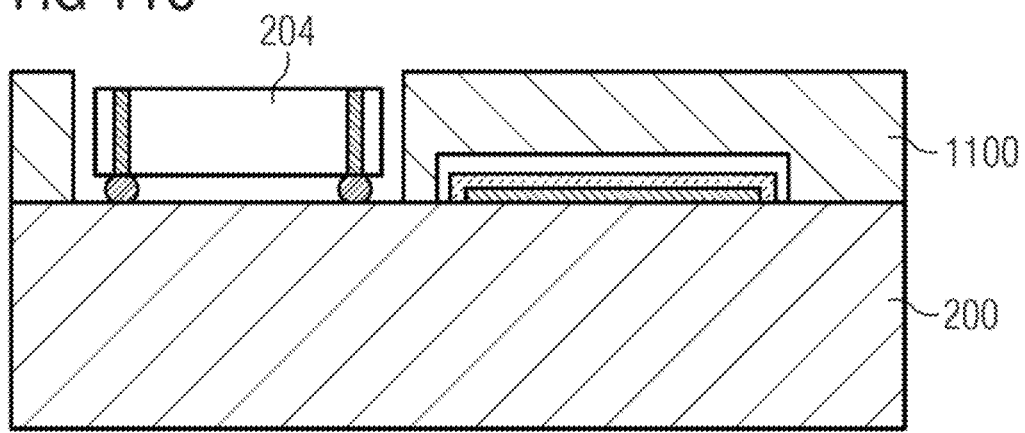
FIG. 11C shows a substantive illustration of a further step of one exemplary method for producing a MEMS sound transducer element.

As can be seen in FIG. 11C, a circuit arrangement 204 can be arranged in said opened second cavity 1102b of the second substrate 1100. In this case, the circuit arrangement 204 can be arranged on the first substrate side 201 of the first substrate 200 for example in the manner as described above with reference to FIG. 6.

Figure 11D:
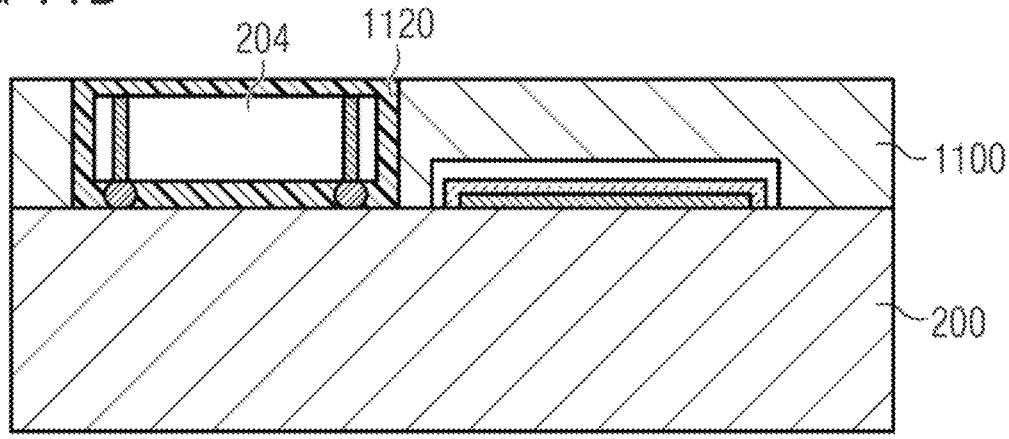
FIG. 11D shows a substantive illustration of a further step of one exemplary method for producing a MEMS sound transducer element.

FIG. 11D reveals that the second cavity 1102b can be filled or potted by means of filler 1120, for example by means of a potting compound composed of polymer and the like. In this case, the circuit arrangement 204 can be potted by means of the filler for example in the manner as described above with reference to FIG. 7.

Figure 11E:
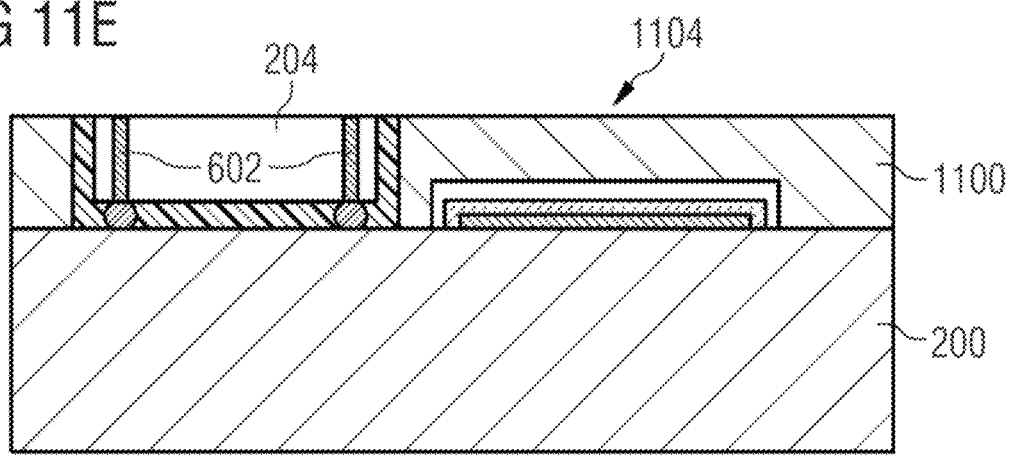
FIG. 11E shows a substantive illustration of a further step of one exemplary method for producing a MEMS sound transducer element.

As depicted in FIG. 11E, the substrate side 1104 of the second substrate 1100 facing away from the first substrate 200 can be ground or polished with material removal. In this case, sufficient material of the filler 1120 and of the second substrate 1100 can be removed until the circuit arrangement 204 is exposed.

The circuit arrangement 204 can have plated-through holes 602, for example, as described above with reference to FIG. 6. Said plated-through holes 602 can likewise be exposed as a result of the abovementioned material removal of the second substrate 1100.

Figure 11F:
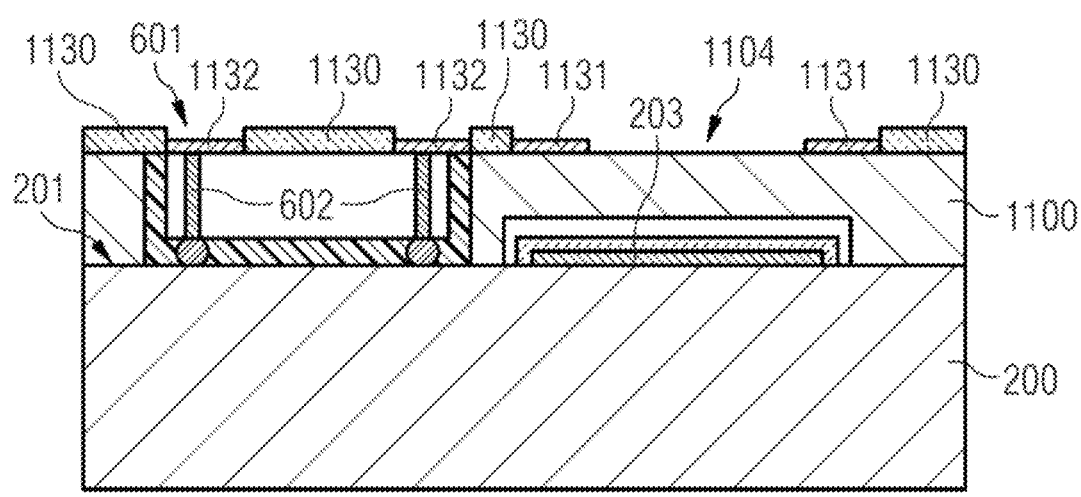
FIG. 11F shows a substantive illustration of a further step of one exemplary method for producing a MEMS sound transducer element.

FIG. 11F shows a method step in which at least one contact section 1132 for electrically contacting the MEMS sound transducer element 100 or the circuit arrangement 204 is provided. Two contact sections 1132 are depicted here, which are respectively connected to one of the two plated-through holes 602 depicted.

In this case, the contact sections 1132 are arranged on a side 601 of the circuit arrangement 204 facing away from the first substrate side 201 of the first substrate 200.

Furthermore, contact sections 1131 are depicted here, which contact sections can be arranged on the substrate side 1104 of the second substrate 1100 facing away from the first substrate side 201 of the first substrate 200. Said contact sections 1131 here are arranged by way of example in a ring-shaped fashion in the region of the underlying membrane layer 203. This can involve a so-called solder ring. Said solder ring 1131 can be arranged in the region of the opening 302 to be formed later in the covering 301, said opening forming a sound hole or a sound port.

Furthermore, an RDL layer 1130 (abbreviation of redistribution layer) can be provided. Said RDL layer 1130 can likewise be arranged on at least a side 601 of the circuit arrangement 204 facing away from the first substrate side 201 of the first substrate 200 or on the substrate side 1104 of the second substrate 1100 facing away from the first substrate side 201 of the first substrate 200.

Figure 11G:
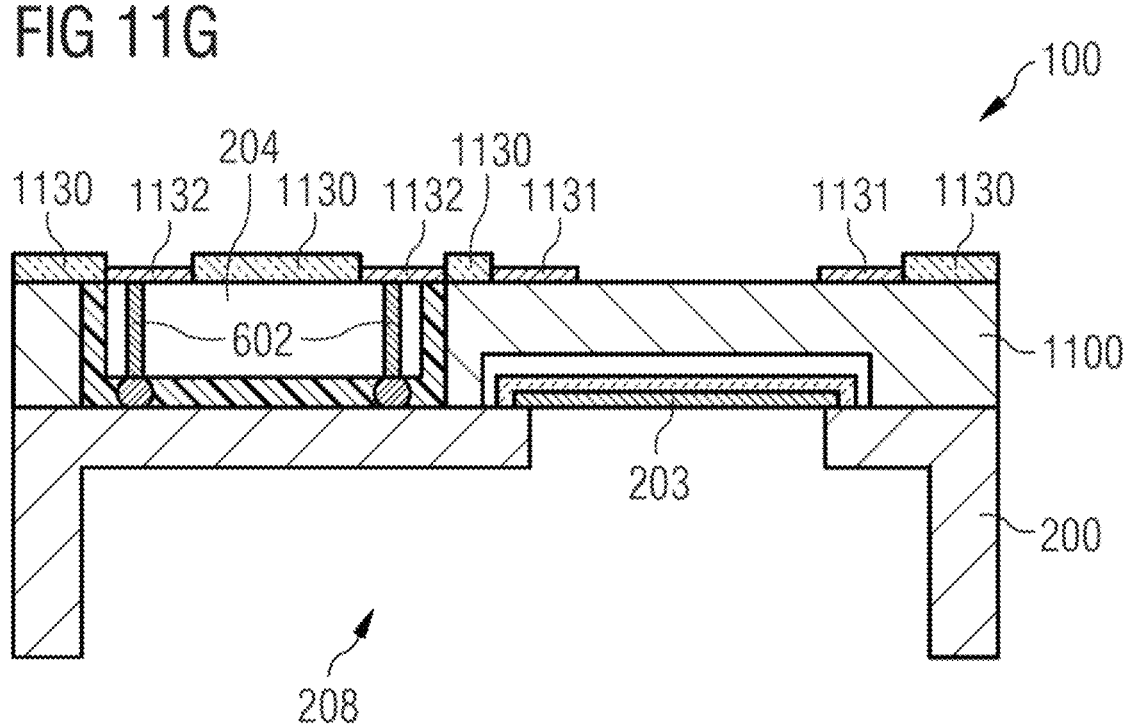
FIG. 11G shows a substantive illustration of a further step of one exemplary method for producing a MEMS sound transducer element.

FIG. 11G depicts a further method step. Here the cavity 208 is formed in the first substrate 200 by means of the two-stage etching process described thoroughly above with reference to FIGS. 2A to 2H. The cavity 208 forms the back volume 250 for the membrane layer 203.

The structure produced in this case and depicted in FIG. 11G forms a MEMS sound transducer element 100.

Figure 11H:
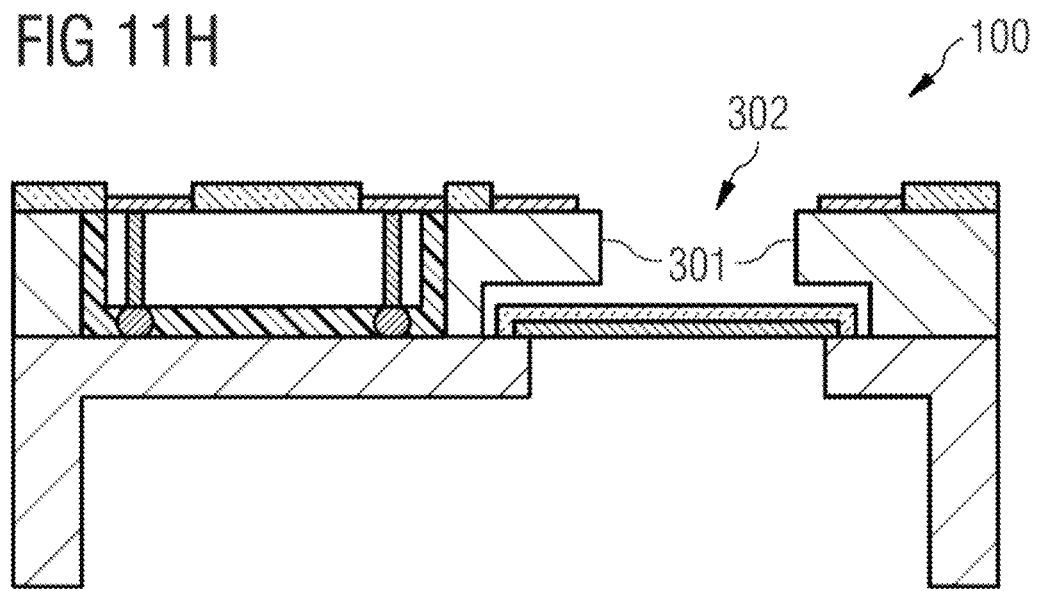
FIG. 11H shows a substantive illustration of a further step of one exemplary method for producing a MEMS sound transducer element.

FIG. 11H shows a further method step. Here an opening 302 is introduced on a substrate side 1104 of the second substrate 1100 arranged opposite the first substrate side 201 of the first substrate 200. Said opening 302 extends through the second substrate 1100 and exposes the membrane layer 203.

The structure of the second substrate 1100 that is produced in this case and depicted in FIG. 11H forms the covering 301 described above with reference to FIG. 3, wherein said covering 301 has a hole 302 enabling the passage of sound waves.

Figure 11I:
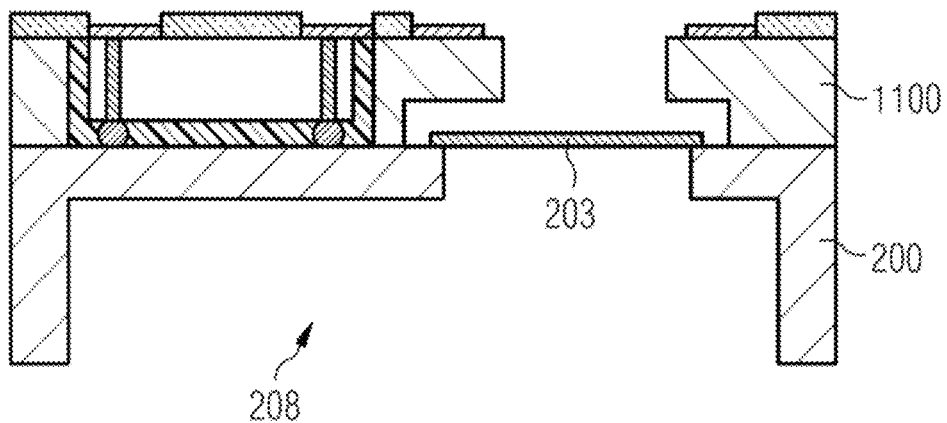
FIG. 11I shows a substantive illustration of a further step of one exemplary method for producing a MEMS sound transducer element.

FIG. 11I depicts a further method step. Here the protective layer 1103 mentioned above is removed from the membrane layer 203. The membrane layer 203 can now oscillate freely above the cavity 208.

Figure 11J:
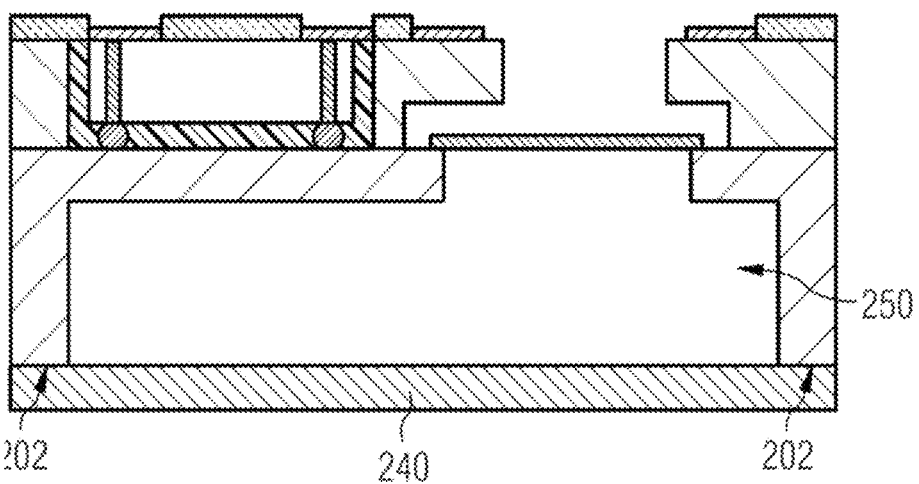
FIG. 11J shows a substantive illustration of a further step of one exemplary method for producing a MEMS sound transducer element.

FIG. 11J shows a further method step. Here a cover 240 described above with reference to FIG. 3 is arranged on the second substrate side 202 of the first substrate 200, as a result of which a closed back volume 250 can be produced.

The cover 240 can likewise be a substrate, that is to say a third substrate. The first substrate 200, the second substrate 1100 and the third substrate 240 can be wafer substrates. That is to say that the method disclosed herein can be implementable at the wafer level. The individual MEMS sound transducer elements 100 can be singulated in a further method step, not explicitly depicted here.

The subject matter of the present disclosure will be summarized again in different words below.

At the present time, the following two requirements, in particular, are made of MEMS microphones:

1. high acoustic performance with regard to a greater signal-to-noise ratio (SNR); and 2. small package size The acoustic performance is directly correlated with the so-called back volume 250. A general rule here is: the larger the back volume 250, the greater the acoustic performance. Accordingly, the first requirement regarding the high acoustic performance is strongly coupled with a large back volume 250, and hence however also necessarily with a large package size.

Since the two requirements are mutually exclusive, and conventional package concepts (FIG. 12) are not suitable for resolving these contradictions, a novel package concept is desirable. The aspect ratio between back volume and the package size should be increased in this case.

So-called OCPs (abbreviation of open cavity package) are normally used for MEMS microphones (see FIG. 12). In this case, the back volume 1250 is realized by means of a cover 1201 fixed to the substrate 1200. The back volume 1250 is occasionally provided by means of a pre-mold substrate or by means of specific lamination techniques. Various types of covers 1201 and materials are used for this purpose, for example metal caps or molded covers.

Moreover, various substrates are usable, such as, for example, printed circuit boards, so called PCBs, lead frames or premolded multilayer substrates. The fitting of the cover 1201 is often performed by means of adhesive bonding or soldering.

The aspect ratio between back volume 1250 and package size is adversely influenced, however, on account of the fact that the individual dies 1202, 1203 are arranged within the cavity 1208 provided. For this reason, the back volume 1250 is reduced by the volume of the individual chips 1202, 1203 and the glob top of the application specific integrated circuit 1202, ASIC for short. The aspect ratio between back volume 1250 and package size is thus limited by these known design concepts.

The concept of the present disclosure is based, inter alia, on a two-stage etching process for a back-side cavity 208. The back-side cavity 208 of a MEMS microphone should normally have approximately the same shape and size as the membrane 203. However, in the case of a two-stage etching process, in accordance with the concept of the present disclosure, the cavity 208 can turn out to be larger than the membrane 203, and the shape is moreover independent.

Consequently, this technique allows the size of the back volume 250 to be artificially enlarged. This can be utilized to produce a considerable back volume 250 at the wafer level (see e.g. FIG. 3). Apart from that, the back volume 250 can additionally be closed with a covering wafer 240, which can be mounted by means of wafer-to-wafer bonding processes.

In one simple embodiment, solder pads 205 for second level packaging can be arranged on the front side 201 of the unit 100. Accordingly, the MEMS microphone 100 would be embodied as a so-called top port microphone.

FIGS. 11A to 11J show some exemplary embodiments. One fundamental concept consists in forming the back volume 250 jointly with the back-side cavity 208 of the MEMS component 100 by carrying out a two-stage photolithography and a two-stage etching process. A series of additional options in respect of method steps can be implementable, and some parts can optionally be removable, such as the covering 301, for example, without in so doing adversely affecting the fundamental concept of the present disclosure.

The MEMS sound transducer element 100 and respectively the method for producing a MEMS sound transducer element 100 can furthermore be implementable in the form of the following conceivable exemplary embodiments.

A method for producing a MEMS sound transducer element (100) comprising the following steps: providing a first substrate (200) having a first substrate side (201), an opposite second substrate side (202) and a membrane layer (203) arranged on the first substrate side (201), carrying out first etching from the second substrate side (202) in a first surface section (221), which is situated opposite the membrane layer (203), as far as a first depth ($d_1$), carrying out second etching from the second substrate side (202) in a second surface section (222), which is larger than the first surface section (221) and includes the first surface section (221), in order to expose the membrane layer (203) in the first surface section (221) and to produce a back volume for the membrane layer (203).

The method according to exemplary embodiment 1, furthermore comprising applying a cover (240) on the second substrate side (202), wherein the cover (240) together with the first substrate (200) forms a closed cavity (208), which provides the back volume for the membrane layer (203).

The method according to exemplary embodiment 1, wherein, before the first etching, a first etching mask (211) is arranged on the second substrate side (202) whilst omitting the first surface section (221) situated opposite the membrane layer (203), and wherein the first etching is effected using the first etching mask (211).

The method according to exemplary embodiment 1, wherein, before the second etching, a second etching mask (212) is arranged on the second substrate side (202), wherein the second etching mask (212) surrounds the second surface section (222), and wherein the second etching is effected using the second etching mask (212).

The method according to exemplary embodiment 1, wherein, before the first etching and before the second etching, a first and a second etching mask (211, 212) are arranged on the second substrate side (202), wherein the first etching mask (211) has a cutout in the first surface section (221) situated opposite the membrane layer (203), and the second etching mask (212) surrounds the second surface section (222), and wherein the first etching is effected using the first etching mask (211) and the second etching is effected using the second etching mask (212).

The method according to exemplary embodiment 5, wherein the first etching mask (211) covers the second etching mask (212) at least in sections.

The method according to exemplary embodiment 1, furthermore comprising arranging a covering (301) on the first substrate side (201), wherein the covering (301) is spaced apart from the membrane layer (203) and covers the membrane layer (203) at least in sections, and wherein the covering (301) has an opening (302) situated opposite the membrane layer (203).

The method according to exemplary embodiment 1, furthermore comprising arranging a contact section (205) for electrically contacting the MEMS sound transducer element (100), wherein the contact section (205) is arranged on the first substrate side (201).

The method according to exemplary embodiment 1, furthermore comprising providing a circuit arrangement (204) on the first substrate side (201), wherein the circuit arrangement (204) is a circuit arrangement that is integrated in the first substrate side (201), or wherein the circuit arrangement (204) is a circuit arrangement that is embodied in a separate element (263) and is at least mechanically or electrically coupled to the first substrate (200).

The method according to exemplary embodiment 9, furthermore comprising arranging a contact section (205) for electrically contacting the MEMS sound transducer element (100), wherein the contact section (205) is arranged on a side (601) of the circuit arrangement (204) facing away from the first substrate side (201).

The method according to exemplary embodiment 1, furthermore comprising providing a circuit arrangement (204) and arranging the circuit arrangement (204) within the back volume (250).

The method according to exemplary embodiment 1, furthermore comprising potting at least the first substrate side (201) with a potting compound.

The method according to exemplary embodiment 1, furthermore comprising arranging a protective layer on a side of the membrane layer facing away from the first substrate side.

The method according to exemplary embodiment 1, furthermore comprising providing a second substrate having at least one cavity, and arranging the second substrate on the first substrate side of the first substrate, wherein the membrane layer is situated within the cavity.

The method according to exemplary embodiment 14, furthermore comprising arranging a circuit arrangement in a second cavity of the second substrate.

The method according to exemplary embodiment 14, furthermore comprising arranging a contact section (205) for electrically contacting the MEMS sound transducer element (100), wherein the contact section (205) is arranged on at least a side of the second substrate facing away from the first substrate side (201) of the first substrate (200) or a side of the circuit arrangement (204) facing away from the first substrate side (201) of the first substrate (200).

The method according to exemplary embodiment 15, wherein an opening is introduced on a substrate side of the second substrate that is arranged opposite the first substrate side (201) of the first substrate (200), said opening extending into the cavity of the second substrate.

The method according to exemplary embodiment 1, wherein the first substrate (200) is a wafer substrate and the method is carried out at the wafer level.

A MEMS sound transducer element (100) comprising a first substrate (200) having a first substrate side (201), an opposite second substrate side (202), and a membrane layer (203) arranged on the first substrate side (201), wherein the first substrate (200) has a cavity (208), which in the region of the membrane layer (203) defines a first opening (209) in the first substrate side (201), wherein the first opening (209) extends over a first surface section (221), and wherein the membrane layer (203) is arranged in a freely oscillating fashion above the first opening (209), wherein the cavity (209 defines a second opening (210) in the second substrate side (202), wherein the second opening (210) extends over a second surface section (222) and forms a back volume of the MEMS sound transducer element (100), wherein the second surface section (222) is larger than the first surface section (221) and includes the first surface section (221).

The MEMS sound transducer element (100) according to exemplary embodiment 19, wherein a cover (240) is arranged on the second substrate side (202), and the cover (240) closes the cavity (208) forming the back volume (250).

The MEMS sound transducer element (100) according to exemplary embodiment 19, wherein a covering (301) is arranged on the first substrate side (201), said covering being spaced apart from the membrane layer (203) and covering the membrane layer (203) at least in sections, and wherein the covering (301) has an opening (302) situated opposite the membrane layer (203).

The MEMS sound transducer element (100) according to exemplary embodiment 19, wherein a contact section (205) for electrically contacting the MEMS sound transducer element (100) is arranged on the first substrate side (201).

The MEMS sound transducer element (100) according to exemplary embodiment 19, wherein the MEMS sound transducer element (100) comprises a circuit arrangement (204) arranged on the first substrate side (201), wherein the circuit arrangement (204) is a circuit arrangement that is integrated in the first substrate side (201), or wherein the circuit arrangement (204) is a circuit arrangement that is embodied in a separate element (263) and is at least mechanically or electrically coupled to the first substrate (200).

The MEMS sound transducer element (100) according to exemplary embodiment 23, wherein a contact section (205) for electrically contacting the MEMS sound transducer element (100) is arranged on a side (601) of the circuit arrangement (204) facing away from the first substrate side (201).

The MEMS sound transducer element (100) according to exemplary embodiment 19, wherein the MEMS sound transducer element (boo) comprises a circuit arrangement (204) arranged within the back volume (250).

Although some aspects have been described in association with a device, it goes without saying that these aspects also constitute a description of the corresponding method, and so a block or a component of a device should also be understood as a corresponding method step or as a feature of a method step. Analogously thereto, aspects that have been described in association with or as a method step also constitute a description of a corresponding block or detail or feature of a corresponding device. Some or all of the method steps can be carried out by a hardware apparatus (or using a hardware apparatus) such as, for example, a microprocessor, a programmable computer or an electronic circuit. In some exemplary embodiments, some or a plurality of the most important method steps can be performed by such an apparatus.

Depending on specific implementation requirements, exemplary embodiments can be implemented using hardware or using software or at least partly using hardware or at least partly using software. The implementation can be carried out using a digital storage medium, for example a floppy disk, a DVD, a Blu-Ray disc, a CD, a ROM, a PROM, an EPROM, an EEPROM or a FLASH memory, a hard disk or some other magnetic or optical storage unit on which are stored electronically readable control signals which can cooperate or cooperate with a programmable computer system in such a way that the respective method is carried out. Therefore, the digital storage medium can be computer-readable.

Some exemplary embodiments thus comprise a data carrier having electronically readable control signals that are able to cooperate with a programmable computer system in such a way that one of the methods described herein is carried out.

Generally, exemplary embodiments can be implemented as a computer program product comprising a program code, wherein the program code is effective in respect of carrying out one of the methods when the computer program product runs on a computer.

The program code can for example also be stored on a machine-readable carrier.

Other exemplary embodiments comprise the computer program for carrying out one of the methods described herein, wherein the computer program is stored on a machine-readable carrier. In other words, one exemplary embodiment of the method is therefore a computer program comprising a program code for carrying out one of the methods described herein when the computer program runs on a computer.

A further exemplary embodiment of the method is therefore a data carrier (or a digital storage medium or a computer-readable medium) on which the computer program for carrying out one of the methods described herein is recorded. The data carrier or the digital storage medium or the computer-readable medium is typically tangible and/or nonvolatile.

A further exemplary embodiment of the method is therefore a data stream or a sequence of signals that constitutes or constitute the computer program for carrying out one of the methods described herein. The data stream or the sequence of signals can be configured for example to the effect of being transferred via a data communication connection, for example via the Internet.

A further exemplary embodiment comprises a processing device, for example a computer or a programmable logic component, which is configured or adapted to the effect of carrying out one of the methods described herein.

A further exemplary embodiment comprises a computer on which the computer program for carrying out one of the methods described herein is installed.

A further exemplary embodiment comprises a device or a system designed to transmit a computer program for carrying out at least one of the methods described herein to a receiver. The transmission can be effected electronically or optically, for example. The receiver can be for example a computer, a mobile device, a storage device or a similar device. The device or the system can comprise for example a file server for transmitting the computer program to the receiver.

In some exemplary embodiments, a programmable logic component (for example a field programmable gate array, an FPGA) can be used to carry out some or all functionalities of the methods described herein. In some exemplary embodiments, a field programmable gate array can cooperate with a microprocessor in order to carry out one of the methods described herein. Generally, the methods in some exemplary embodiments are carried out on the part of an arbitrary hardware device. The latter can be universally usable hardware such as a computer processor (CPU) or hardware specific to the method, such as an ASIC, for example.

The exemplary embodiments described above merely represent an illustration of the principles of the present disclosure. It goes without saying that modifications and variations of the arrangements and details described herein will be apparent to others skilled in the art. Therefore, the intention is for the disclosure to be restricted only by the scope of protection of the following patent claims and not by the specific details that have been presented herein on the basis of the description and the explanation of the exemplary embodiments.

What is claimed is:

1. A method for producing a MEMS sound transducer element comprising the following steps:
   providing a first substrate having a first substrate side, an opposite second substrate side and a membrane layer arranged on the first substrate sided;
   providing a circuit arrangement adjacent to and non-overlapping with the membrane layer in a direction parallel to the first substrate side of the first substrate;
   performing a first etching of the first substrate from the second substrate side in a first surface section, which is situated opposite the membrane layer, as far as a first depth; and
   performing a second etching of the first substrate from the second substrate side in a second surface section in order to expose the membrane layer in the first surface section and to produce a back volume for the membrane layer, wherein the second surface section is larger than the first surface section and includes the first surface section.

2. The method as claimed in claim 1, further comprising applying a cover on the second substrate side, wherein the cover together with the first substrate forms a closed cavity that provides the back volume for the membrane layer.

3. The method as claimed in claim 1, wherein, before the first etching, arranging a first etching mask on the second substrate side while omitting the first surface section situated opposite the membrane layer, and wherein the first etching is effected using the first etching mask.

4. The method as claimed in claim 1, wherein, before the second etching, arranging a second etching mask on the second substrate side, wherein the second etching mask surrounds the second surface section, and wherein the second etching is effected using the second etching mask.

5. The method as claimed in claim 1, wherein, before the first etching and before the second etching, arranging a first etching mask and a second etching mask on the second substrate side, wherein the first etching mask has a cutout in the first surface section situated opposite the membrane layer, and the second etching mask surrounds a second surface section, and wherein the first etching is effected using the first etching mask and the second etching is effected using the second etching mask.

6. The method as claimed in claim 5, wherein the first etching mask covers the second etching mask at least in sections.

7. The method as claimed in claim 1, further comprising arranging a covering on the first substrate side, wherein the covering is spaced apart from the membrane layer and covers the membrane layer at least in sections, and wherein the covering has an opening situated opposite the membrane layer.

8. The method as claimed in claim 1, further comprising arranging a contact section for electrically contacting the MEMS sound transducer element, wherein the contact section is arranged on the first substrate side.

9. The method as claimed in claim 1, further comprising providing the circuit arrangement on the first substrate side, wherein the circuit arrangement is a circuit arrangement that is integrated in the first substrate side, or wherein the circuit arrangement is a circuit arrangement that is embodied in a separate element and is at least mechanically or electrically coupled to the first substrate.

10. The method as claimed in claim 9, further comprising arranging a contact section for electrically contacting the MEMS sound transducer element, wherein the contact section is arranged on a side of the circuit arrangement facing away from the first substrate side.

11. The method as claimed in claim 1, further comprising providing the circuit arrangement and arranging the circuit arrangement within the back volume.

12. The method as claimed in claim 1, further comprising potting at least the first substrate side with a potting compound.

13. The method as claimed in any claim 1, further comprising arranging a protective layer on a side of the membrane layer facing away from the first substrate side.

14. The method as claimed in claim 1, further comprising providing a second substrate having at least one cavity, and arranging the second substrate on the first substrate side of the first substrate, wherein the membrane layer is situated within the cavity.

15. The method as claimed in claim 14, further comprising arranging the circuit arrangement in a second cavity of the second substrate.

16. The method as claimed in claim 15, further comprising arranging a contact section for electrically contacting the MEMS sound transducer element, wherein the contact section is arranged on at least a side of the second substrate facing away from the first substrate side of the first substrate or a side of the circuit arrangement facing away from the first substrate side of the first substrate.

17. The method as claimed in claim 15, wherein an opening is introduced on a substrate side of the second substrate that is arranged opposite the first substrate side of the first substrate, said opening extending into the cavity of the second substrate.

18. The method as claimed in claim 1, wherein the first substrate is a wafer substrate and the method is carried out at a wafer level.

19. A micro electro mechanical system (MEMS) sound transducer element comprising:
- a first substrate having a first substrate side, an opposite second substrate side, and a membrane layer arranged on the first substrate side; and
- a circuit arrangement adjacent to and non-overlapping with the membrane layer in a direction parallel to the first substrate side of the first substrate,
- wherein the first substrate has a cavity that defines a first opening in the first substrate side in a region of the membrane layer, wherein the first opening extends over a first surface section, and wherein the membrane layer is arranged to freely oscillate above the first opening,
- wherein the cavity defines a second opening in the second substrate side, wherein the second opening extends over a second surface section and forms a back volume of the MEMS sound transducer element, wherein the second surface section is larger than the first surface section and includes the first surface section.

20. The MEMS sound transducer element as claimed in claim 19, wherein a cover is arranged on the second substrate side, and the cover closes the cavity forming the back volume.

21. The MEMS sound transducer element as claimed in claim 19, wherein a covering is arranged on the first substrate side, the covering is spaced apart from the membrane layer and covering the membrane layer at least in sections, and the covering has an opening situated opposite the membrane layer.

22. The MEMS sound transducer element as claimed in claim 19, wherein a contact section for electrically contacting the MEMS sound transducer element is arranged on the first substrate side.

23. The MEMS sound transducer element as claimed in claim 19, wherein the MEMS sound transducer element comprises the circuit arrangement arranged on the first substrate side, wherein the circuit arrangement is a circuit arrangement that is integrated in the first substrate side, or wherein the circuit arrangement is a circuit arrangement that is embodied in a separate element and is at least mechanically or electrically coupled to the first substrate.

24. The MEMS sound transducer element as claimed in claim 23, wherein a contact section for electrically contacting the MEMS sound transducer element is arranged on a side of the circuit arrangement facing away from the first substrate side.

25. The MEMS sound transducer element as claimed in claim 19, wherein the MEMS sound transducer element comprises the circuit arrangement arranged within the back volume.

* * * * *

UNITED STATES PATENT AND TRADEMARK OFFICE
CERTIFICATE OF CORRECTION

PATENT NO. : 10,616,703 B2
APPLICATION NO. : 15/946443
DATED : April 7, 2020
INVENTOR(S) : Matthias Steiert Page 1 of 1

It is certified that error appears in the above-identified patent and that said Letters Patent is hereby corrected as shown below:

In the Claims

In Column 15, Line 51, Claim 1, delete "sided" and insert --side--.

Signed and Sealed this
First Day of September, 2020

Andrei Iancu
*Director of the United States Patent and Trademark Office*